United States Patent
Ali et al.

(10) Patent No.: US 8,339,303 B2
(45) Date of Patent: Dec. 25, 2012

(54) METHOD FOR IMPROVING THE PERFORMANCE OF THE SUMMING-NODE SAMPLING CALIBRATION ALGORITHM

(75) Inventors: Ahmed Mohamed Abdelatty Ali, Oak Ridge, NC (US); Huseyin Dinc, Greensboro, NC (US); Paritosh Bhoraskar, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 106 days.

(21) Appl. No.: 13/094,280

(22) Filed: Apr. 26, 2011

(65) Prior Publication Data

US 2012/0274492 A1    Nov. 1, 2012

(51) Int. Cl.
*H03M 1/34* (2006.01)
(52) U.S. Cl. .......... 341/162; 341/161; 341/172

(58) Field of Classification Search ............ 341/161, 341/162, 172
See application file for complete search history.

(56) References Cited

U.S. PATENT DOCUMENTS

| | | | | |
|---|---|---|---|---|
| 6,803,873 B1 * | 10/2004 | Motomatsu | .............. | 341/161 |
| 7,187,318 B1 * | 3/2007 | Lee et al. | .............. | 341/161 |
| 7,592,938 B2 * | 9/2009 | Hsueh et al. | .............. | 341/118 |
| 7,764,216 B2 * | 7/2010 | Oshima et al. | .............. | 341/172 |

* cited by examiner

*Primary Examiner* — Khai M Nguyen
(74) *Attorney, Agent, or Firm* — Kenyon & Kenyon LLP

(57) ABSTRACT

An integrated circuit allows for the isolation of the input of an analog-to-digital converter (ADC) from a summing-node (SNS) algorithm. The integrated circuit contains a gating device that is controlled by bits of a flash analog-to-digital converter (ADC) to gate input samples to sub-ranges that are used by the SNS algorithm. A single sub-range is chosen to be used by the SNS algorithm.

65 Claims, 6 Drawing Sheets

METHOD FOR IMPROVING THE PERFORMANCE OF THE SUMMING-NODE SAMPLING CALIBRATION ALGORITHM

FIELD OF THE INVENTION

The present invention relates to a method for improving the performance of a summing-node calibration algorithm. The present invention further relates to an integrated circuit that improves the accuracy of the gain estimation of the summing-node calibration algorithm through clock gating.

BACKGROUND INFORMATION

The following patent is hereby incorporated by reference herein: U.S. Pat. No. 7,271,750 ("the '750 patent"), issued Sep. 18, 2007.

Pipelined analog-to-digital converters ("ADCs") that are used for converting analog signals into their digital representations often require specific signal-to-noise ratios and/or high sampling rates. These converters contain a multiplying DAC ("MDAC") and a flash ADC, and may require large sampling capacitors and a high-speed and high-gain amplifier (or operational transconductance amplifier (OTA)). The residue amplifier, typically, consists of two stages. Often the first stage is a cascode differential amplifier and the second stage is a simple differential pair. The residue amplifier has to have a high gain and a high bandwidth for proper operation. A high gain and a high bandwidth requirement typically results in a high power consumption which is not desirable. Reducing the power consumption of the converter may be undertaken by relaxing the gain and/or the bandwidth requirements of the residue amplifier. However, relaxing gain and bandwidth requirements creates inter-stage (gain) errors within the residue amplifier that are temperature and sample-rate (clock-frequency) dependent.

The summing-node sampling ("SNS") calibration algorithm, discussed in the '750 patent, is an algorithm that allows for simultaneously lowering the power consumption of the ADC and correcting for the inter-stage gain errors of the residue amplifier. The SNS algorithm samples the voltage at the summing-node of the MDAC ("summing-node voltage") and processes the samples at a sample rate that is lower than the sample rate of the converter, which results in a low power calibration method. The sampled summing-node voltage is amplified by a predetermined gain and then digitized using a separate analog-to-digital converter. The open-loop gain of the residue amplifier can be estimated from the output of the residue amplifier ("residue voltage") and the summing-node voltage, and therefore the SNS algorithm assists in determining the residue amplifier's open-loop gain. The accuracy of the open-loop gain estimate does not have to be very high as depicted by equation (i). For example, a residue amplifier with an open-loop gain of 90 dB may only require a 5-bit accurate estimate of its open-loop gain to achieve a 16-bit accuracy in the MDAC's gain (i.e. closed loop gain).

$$\frac{\partial V_o}{V_o} = \frac{K}{A_{act}} \left| \frac{\partial A_{est}}{A_{est}} \right|, \quad (i)$$

where $V_o$ is the residue voltage, $A_{est}$ is the estimated open-loop gain of the residue amplifier, $A_{act}$ is the actual open-loop gain, and K is the inverse of the feedback factor.

The digitized summing-node voltage and a separately digitized residue voltage are high pass filtered and processed using a least-mean-square ("LMS") algorithm to filter noise and estimate the open-loop gain of the residue amplifier. The LMS algorithm is used by the SNS calibration algorithm and can correct the inter-stage gain error of the MDAC through a digital correction or through an analog correction.

While the SNS algorithm does not have a large power consumption and can also correct for nonlinearity, it has a number of drawbacks. A measurement of the summing-node voltage may be affected by the input signal due to coupling, as sampling occurs at every sub-range of the MDAC and all of the samples are used by the algorithm. Therefore, the estimate of the open-loop gain of the residue amplifier may be dependent on the input signal. Any fluctuation at the input will lead to a variation in the gain estimate of the residue amplifier, limiting the effectiveness of the SNS algorithm.

Thus there remains a need in the art, for an algorithm which may allow for low power consumption and correct inter-stage (gain) error of an MDAC, without outputting a varying estimate of the open-loop gain of the residue amplifier that is dependent on the input signal.

DETAILED DESCRIPTION

The subject invention will now be described in detail for specific preferred embodiments of the invention, it being understood that these embodiments are intended only as illustrative examples and the invention is not to be limited thereto.

Variation of the gain estimate from a SNS algorithm that is dependent on the input signal to an analog-to-digital converter may be overcome by limiting the samples used by the algorithm to a MDAC sub-range. Embodiments of the present invention provide a front-end of the analog-to-digital converter that is digitally corrected, and an N-gate device that may be connected between an auxiliary ADC and sampling network and unit performing a summing-node algorithm. The ADC may be a pipelined ADC containing multiple stages, where each stage may contain an MDAC and a flash ADC. The flash ADC may control the n-gate device to gate the sampled or digitized summing-node voltage, where one sub-range may be used by the SNS algorithm to determine the gain estimate.

Figure 1:
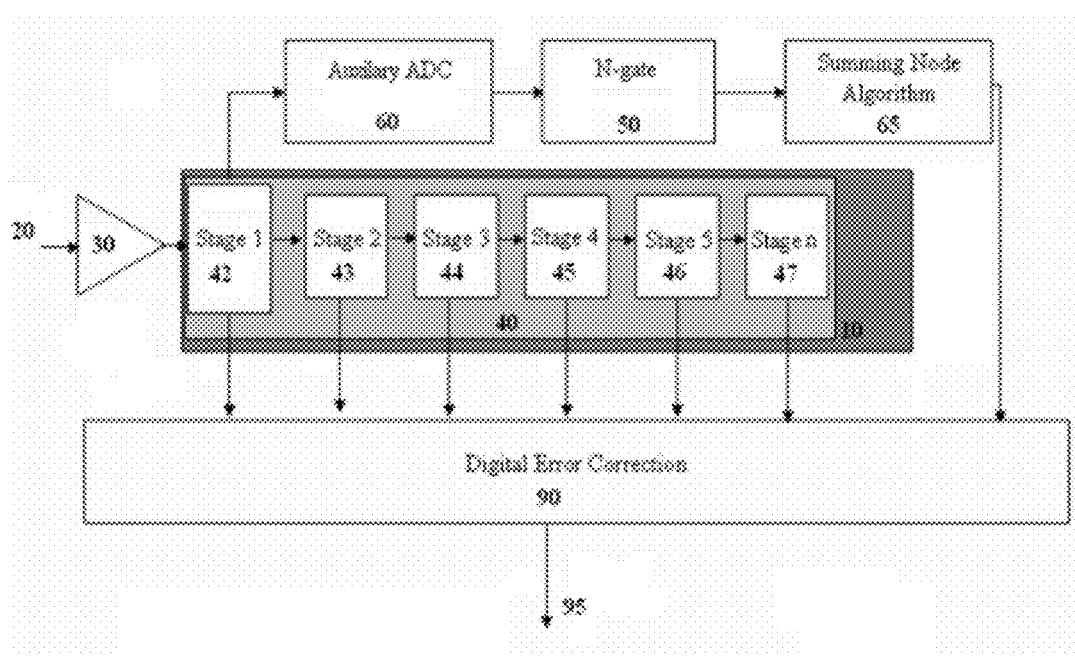
FIG. 1 is a block diagram of a pipelined ADC corrected by the SNS algorithm of the present invention with gating of the digitized summing-node voltage.

FIG. 1 illustrates a diagram of a pipelined analog to digital converter of the present invention. In an embodiment, ADC 10 may be a 16-bit converter and may not use a sample and hold amplifier ("SHA"). ADC 10 may contain a pipeline 40 with a number of stages 42-47 of varying resolution. In an embodiment, the first stage 42 may be 3 bits, the second stage 43 may be 3 bits, and stages 44-47 may each be 3 bits. Input signal 20 may be applied to the input of ADC 10, which may be stored on a sample and hold circuit in the first stage 42 of pipeline 40, since ADC 10 may not use an SHA.

Input buffer 30 may be used to improve distortion and reduce feedback from the sampling capacitors in the sample-and-hold circuit in the first stage 42. Input buffer 30 may be an emitter-follower circuit. Input signal 20 may be applied to the input terminal of input buffer 30. Input buffer 30 may output a signal to drive ADC 10, by outputting a signal to the first stage 42 of pipeline 40, which is sampled on the sampling capacitors in the stage. All the stages of pipeline 40 may output a result to digital error correction unit 90, which may construct the output of ADC 10. Digital error correction unit 90 may correct the inter-stage gain errors and DAC gain errors of pipeline 40 using digital coefficients and/or constants. Digital error correction unit 90 may emit an output 95.

In the embodiment illustrated in FIG. 1, the first stage 42 of pipeline 40 may be connected to an auxiliary ADC 60 through a sampling network, with the output of the auxiliary ADC 60 transmitted to SNS algorithm unit 65 through an N-gate device 50. N-gate cell 50 may allow for gating of the digital data going into summing-node algorithm 65. N-gate cell 50 may allow for the limiting of the input to the SNS algorithm unit 65 to a single sub-range of the first stage 42 as controlled by input code D, which may be determined by the bits of flash analog-to-digital converter ("ADC") 70 in the first stage. Gating of the data going into the summing-node algorithm 65 may occur after the sampling and amplifying of the summing-node voltage. The presence of N-gate cell 50 may also allow for the isolation of the SNS algorithm from the input. Auxiliary ADC 60 may have a bit size lower than ADC 10 and may operate at a slower clock rate than ADC 10. Auxiliary ADC 60 may allow for the amplification of the summing-node voltage. SNS algorithm unit 65 may be connected to the digital correction unit 90. SNS algorithm unit 65 may provide an estimate of the open-loop gain by using a single sub-range of Stage 1.

Figure 2:
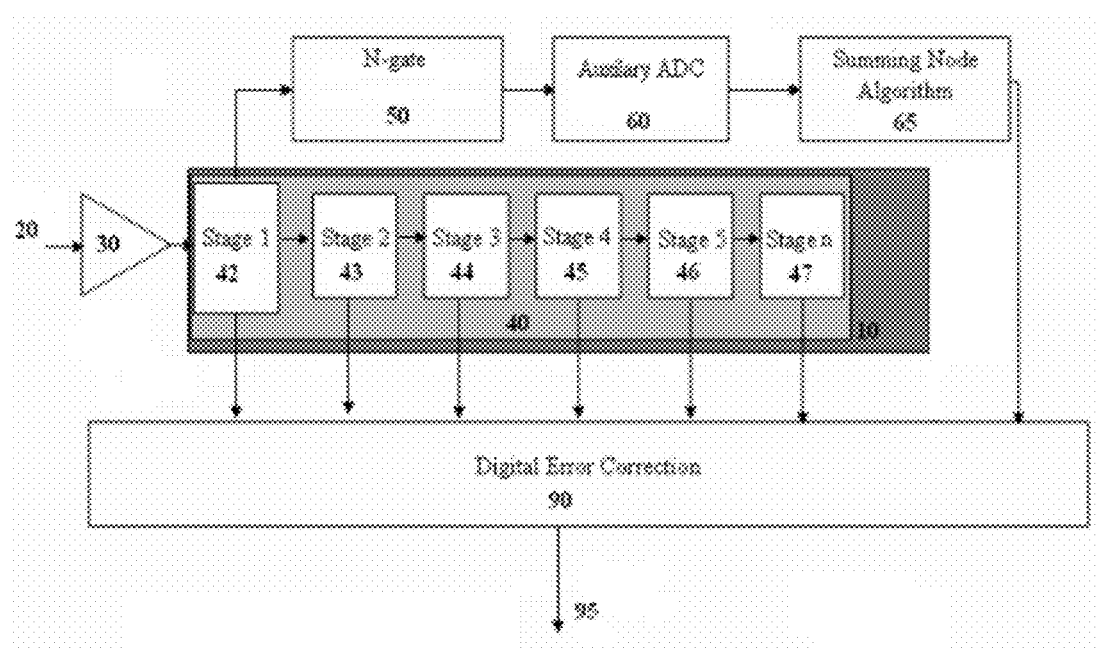
FIG. 2 is a block diagram of a pipelined ADC corrected by the SNS algorithm of the present invention with gating occurring before digitization.

FIG. 2 illustrates a diagram of a pipelined analog-to-digital converter of the present invention where gating occurs before digitizing the summing-node voltage. In an embodiment, the first stage 42 of pipeline 40 may be connected to an n-gate device as shown in FIG. 2. Flash ADC 70 may control N-gate cell 50 through input code D, and the bits of flash ADC 70 may limit the input to auxiliary ADC 60 to a determined sub-range of sampled inputs of the first stage 42. The sampled summing-node voltage may be amplified by auxiliary ADC 60 and output directly to SNS algorithm unit 65. SNS algorithm unit 65 may be connected to the digital correction unit 90 and provide an estimate of the open-loop gain of the amplifier in the MDAC of the first stage.

Figure 3:
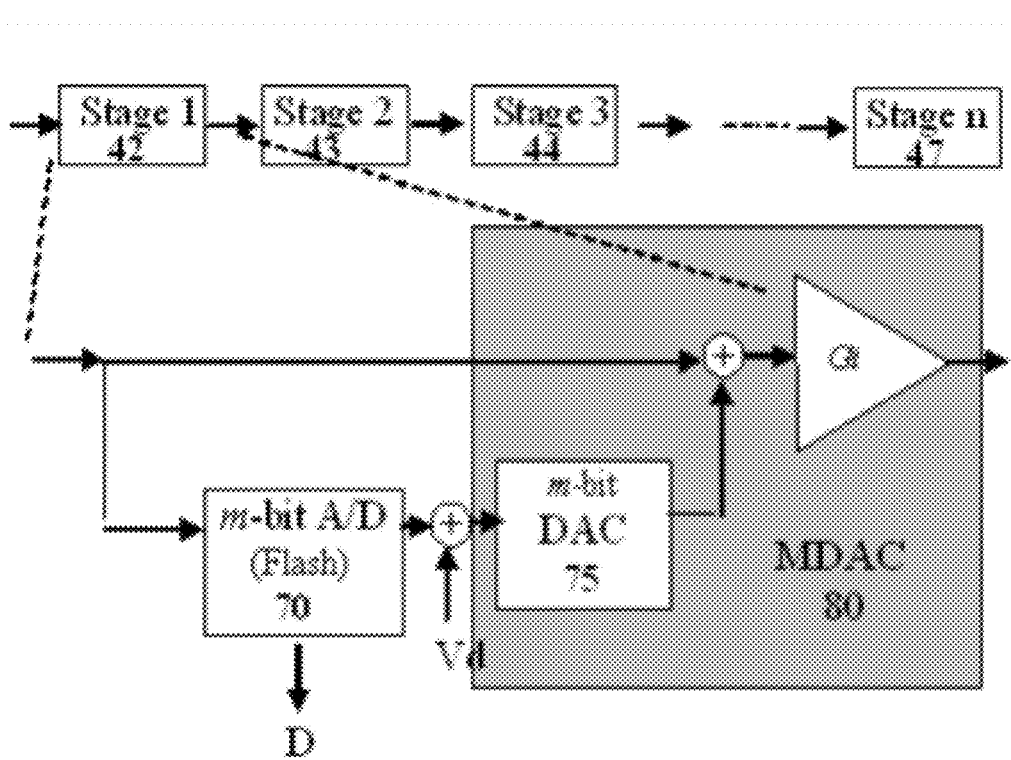
FIG. 3 is a diagram of a first stage of a pipelined ADC.

FIG. 3 further illustrates an individual stage of pipeline 40. Each of the stages 42-47 may include a flash ADC 70 and a DAC 75, where DAC 75 may be situated in MDAC 80. Each of the stages of 42-47 may have an amplifier, illustrated as amplifier 130 in FIG. 5, housed in the MDAC 80, that drives the stage. Flash ADC 70 and DAC 75 may have the same resolution. In an embodiment, flash ADC 70 and DAC 75 of the first stage 42 may be 3 bits. The resolution of stages 43-47 may be the same bit size or a different bit size from the first stage. Flash ADC 70 may output an input code D to N-gate cell 50. In an embodiment as depicted in FIG. 1, input code D may determine which sub-range to output to the SNS algorithm unit 65. In an embodiment such as the system depicted in FIG. 2, the input code may determine which sub-range to output to the auxiliary ADC 60.

Figure 4:
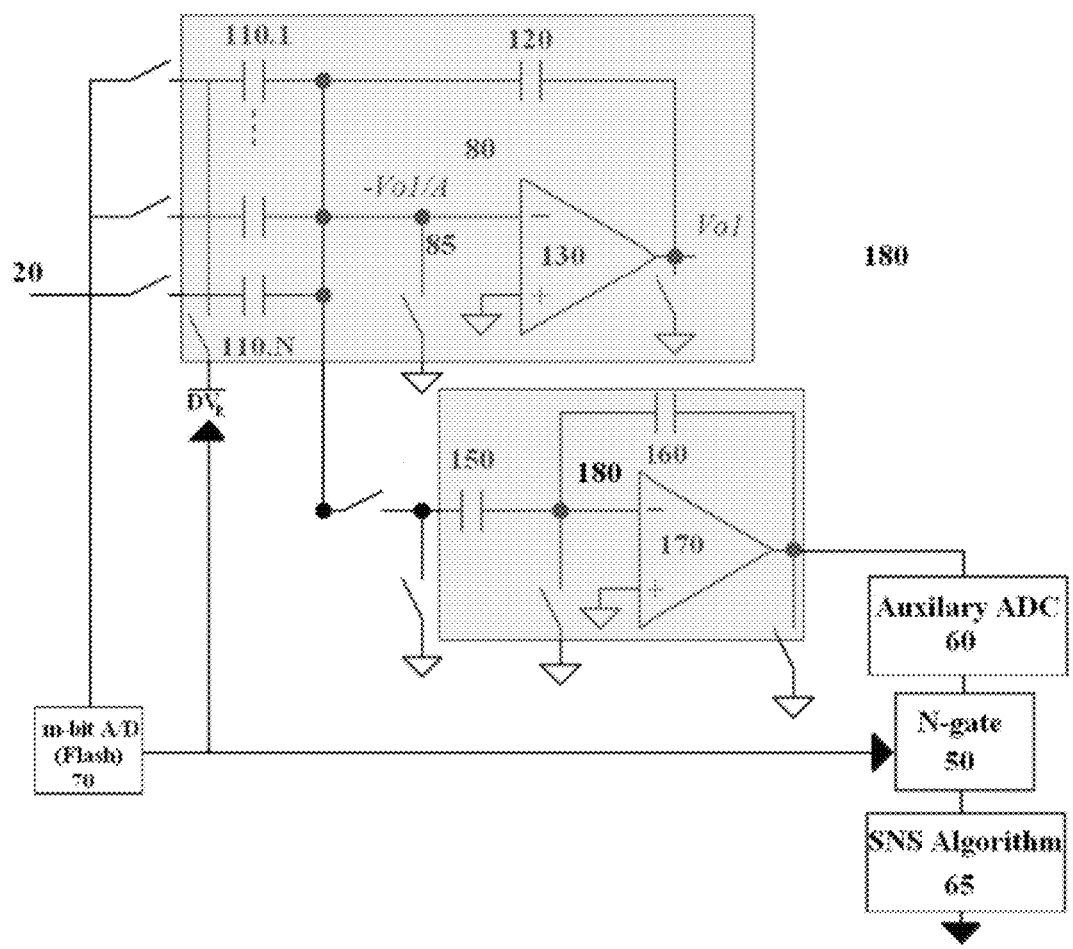
FIG. 4 is a diagram of the integrated circuit with gating of the sampling process of the summing-node voltage input occurring after a connected sampling network and after digitization occurs.

FIG. 4 illustrates the integrated circuit of the summing-node voltage with gating of the input occurring after a sampling network and after digitization by the auxiliary ADC occurs, as demonstrated in the embodiment in FIG. 1. MDAC 80 may contain sampling capacitors 110.1-110.N that are connected to the output of input buffer 30 by a plurality of switches. MDAC 80 may also contain the amplifier 130 which may drive the MDAC. The inverting input terminal of the amplifier 130 may be connected to sampling capacitors 110.1-110.N. The non-inverting terminal of the amplifier 130 may be connected to ground. The output of the amplifier 130 may be connected to a feedback loop which may be connected to capacitor 120. Capacitor 120 may be connected to sampling capacitors 110.1-110.N on one of its capacitor plates.

The summing-node voltage may be determined at node 85, which may be a summing-node of sampling capacitors 110.1-110.N. Node 85 may also be connected to a sampling network and preamplifier. Capacitor 150 may store the summing-node voltage and may be connected to node 85. Capacitors 150 and 160 and amplifier 170 may make up preamplifier 180. Capacitor 150 may also be connected to the inverting input of amplifier 170. The non-inverting input of the amplifier 170 may be connected to ground. The output of the amplifier 170 may be connected via a feedback loop to the inverting input through capacitor 160. The output of the amplifier 170 may also be connected to auxiliary ADC 60.

Auxiliary ADC 60 may digitize the amplified summing-node voltage output from preamplifier 180. Auxiliary ADC 60 may operate at a slower clock rate than ADC 10. The output of auxiliary ADC 60 may be connected to N-gate cell 50. N-gate cell 50 may be selectively controlled by flash ADC 70 in the respective stage of the ADC via an input code D, which may be the output of flash ADC 70. Flash ADC 70 may determine how many sub-ranges to divide the digitized amplified summing-node voltage into, and which sub-range to send through N-gate cell 50 to the SNS algorithm. N-gate cell 50 may output a voltage corresponding to the selected sub-range to SNS algorithm unit 65, which may execute the SNS algorithm for the received voltage from N-gate cell 50.

During operation, an input signal 20 may be applied to ADC 10. The signal may be output by input buffer 30 to ADC 10. A respective switch from the plurality of switches may close, enabling input signal 20 to be applied to the respective sampling capacitor 110.1-110.N. Sampling capacitors 110.1-110.N may store samples of input signal 20 dependent on the closing and opening of the respective switches. The stored charge on capacitors 110.1-110.N is applied to the inverting input of the amplifier 130, which outputs a residue voltage, $V_{o1}$. The voltage at node 85 (summing-node voltage) may be equal to $-V_{o1}/A$, where A is the open-loop gain of the amplifier 130. The summing-node voltage at node 85 may be applied and stored on capacitor 150 in the sampling network and preamplifier. Preamplifier 180 may amplify the stored sampled signal and output the signal to the auxiliary ADC 60.

The auxiliary ADC 60 may digitize the amplified stored signal and may output this digitized data to the N-gate cell 50. Flash ADC 70 may output a code D to N-gate cell 50 that may determine the input level to the ADC 10. The flash ADC 70 may determine the level of the input to the ADC 10 to be within any of the $2^m$ sub-ranges, where m may be equal to the number of bits of flash ADC 70. In an embodiment, flash ADC 70 may have 3-bits and may be used to gate the digitization process of the summing-node voltage by gating the digitized amplified stored sample signal. The digitized amplified summing-node voltage may be divided into 8 groups depending on which sub-range of the input 20 they correspond to. In an example embodiment, the middle sub-range, which correspond to the summing-node voltage values when the amplitude of the input 20 is near zero, may be selected. N-gate cell 50 may output a voltage corresponding to the selected digitized sub-range to SNS algorithm unit 65 which may execute the SNS algorithm.

In an alternate embodiment, a specific selection of the sub-range may be made. The selection of which sub-range to output to SNS algorithm unit 65 may be based on the amplitude of the sampled signal. A signal that spends more time within a sub-range may allow for the selection of that sub-range. An appropriate selection of a sub-range may allow for a faster convergence of the SNS algorithm on a gain estimate. A transition from one sub-range to another may be made, but may be slower than the time constant of the SNS algorithm. If the transition from one sub-range to another is faster than the time constant of the SNS algorithm, the SNS algorithm may still be dependent on the input. A transition time between sub-ranges that is slower than the SNS algorithm time constant may allow for independence of the gain estimate from the input.

The residue voltage, $V_{o1}$, may be output to the subsequent stage of pipeline 40. The digitized voltage corresponding to the selected sub-range and the residue voltage may be high-passed filtered to remove offset. Using the LMS algorithm component of the SNS algorithm, an estimate of the open-loop gain of the amplifier 130 may be made. Digital correction unit 90 may use the estimated open-loop gain to correct the inter-stage gain error of the MDAC 80.

Figure 5:
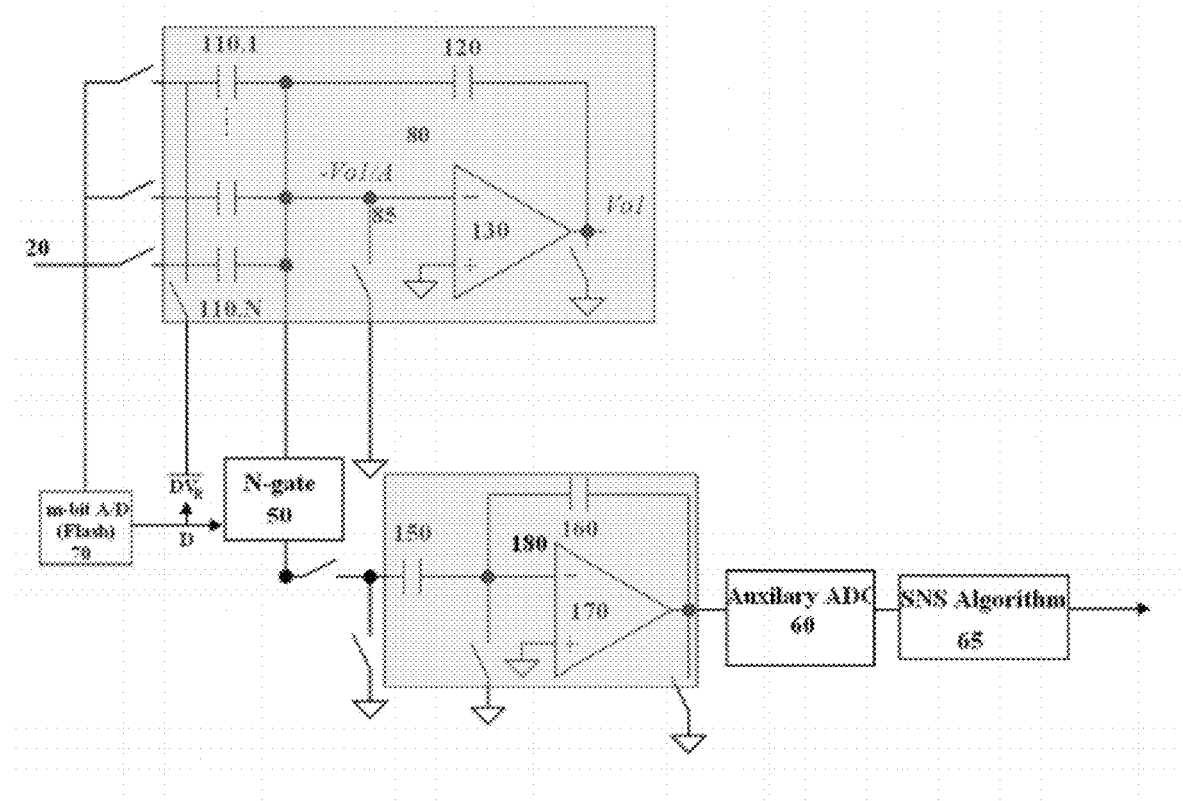
FIG. 5 is a diagram of the integrated circuit of the summing-node voltage sampling with gating of the digitization process of the summing-node voltage occurring before a connected sampling network and before digitizing the summing-node voltage.

FIG. 5 illustrates the integrated circuit of the summing-node voltage with gating of the signal occurring before a connected sampling network and before digitization, as demonstrated in the embodiment in FIG. 2. MDAC 80 may contain sampling capacitors 110.1-110.N that are connected to the output of input buffer 30 by a plurality of switches. MDAC 80 may also contain an amplifier 130 which may drive the MDAC. The inverting input terminal of the amplifier 130 may be connected to sampling capacitors 110.1-110.N. The non-inverting terminal of residue amplifier 130 may be connected to ground. The output of residue amplifier 130 may be connected to a feedback loop which may be connected to capacitor 120. Capacitor 120 may be connected to sampling capacitors 110.1-110.N on one of its capacitor plates.

The summing-node voltage may be determined at node 85, which may be a summing-node of sampling capacitors 110.1-110.N. Node 85 may also be connected to N-gate cell 50. N-gate cell 50 may be selectively controlled by flash ADC 70 in the respective stage of the ADC. Flash ADC 70 may determine how many sub-ranges to divide the summing-node voltage stored on N-gate cell 50 into, and which sub-range to send via the N-gate cell 50 to a connected sampling network and preamplifier.

N-gate cell 50 may be connected to a sampling network and preamplifier at capacitor 150 which may store the sub-range output from N-gate cell 50. Capacitor 150 may be connected to the inverting input of amplifier 170. Capacitors 150 and 160 and amplifier 170 may make up preamplifier 180. The non-inverting input of amplifier 170 may be connected to ground. The output of amplifier 170 may be connected via a feedback loop to the inverting input through capacitor 160. The output of amplifier 170 may also be connected to auxiliary ADC 60. Auxiliary ADC 60 may digitize the amplified sub-range output from preamplifier 180. Auxiliary ADC 60 may operate at a slower clock rate than ADC 10. The output of auxiliary ADC 60 may be connected to the SNS algorithm unit 65. The SNS algorithm unit 65 may execute the SNS algorithm.

During operation, an input signal 20 may be applied to ADC 10. The signal may be output by input buffer 30 to ADC 10. A respective switch from the plurality of switches may close, enabling input signal 20 to be applied to the respective sampling capacitor 110.1-110.N. Sampling capacitors 110.1-110.N may store samples of input signal 20 dependent on the closing and opening of the respective switches. The stored charge on capacitors 110.1-110.N is applied to the inverting input of residue amplifier 130, which outputs a residue voltage, $V_{o1}$. The voltage at node 85 (summing-node voltage) may be equal to $-V_{o1}/A$, where A is the open-loop gain of the MDAC's amplifier 130. The summing-node voltage at node 85 may be output to the N-gate cell 50.

Flash ADC 70 may output a code D to N-gate cell 50 that may determine the input level to the ADC 10. The flash ADC 70 may determine the level of the input to the ADC 10 to be within any of the $2^m$ sub-ranges, where m may be equal to the number of bits of flash ADC 70. In an embodiment, flash ADC 70 may have 3-bits and is used to gate the sampled summing-node voltage. The summing-node voltage may be divided into 8 groups depending on which sub-range of the input 20 they correspond to, and one of the sub-ranges may be output by N-gate cell 50. In an example embodiment, the middle sub-range, which corresponds to the summing-node voltage values, when the amplitude of the input 20 is near zero, may be selected. N-gate cell 50 may output a voltage corresponding to the selected sub-range, to the connected sampling network and preamplifier.

In an alternate embodiment, a specific selection of the sub-range may be made. The selection of which sub-range to output to the sampling network and preamplifier may be based on the amplitude of the sampled signal. A signal that spends more time within a particular sub-range may allow for the selection of that sub-range. An appropriate selection of a sub-range may allow for a faster convergence of the SNS algorithm on a gain estimate. A transition from one sub-range to another may be made, but may be slower than the time constant of the SNS algorithm. If the transition from one sub-range to another is faster than the time constant of the SNS algorithm, the SNS algorithm may still be dependent on the input. A transition time between sub-ranges that is slower than the SNS algorithm time constant may allow for independence of the gain estimate from the input.

The selected sub-range may be amplified by preamplifier 180 by a desired gain. Preamplifier 180 may output the amplified sub-range to auxiliary ADC 60. Auxiliary ADC 60 may digitize the amplified sub-range to SNS algorithm unit 65 which may execute the SNS algorithm.

The residue voltage, $V_{o1}$, may be output to the subsequent stage of pipeline 40. The digitized voltage corresponding to the selected sub-range and the residue voltage may high-passed filtered. The LMS algorithm component of the SNS algorithm and an estimate of the open-loop gain of the amplifier 130 may be made. Digital correction unit 90 may use the estimated open-loop gain to correct the inter-stage gain error of the MDAC 80.

Figure 6:
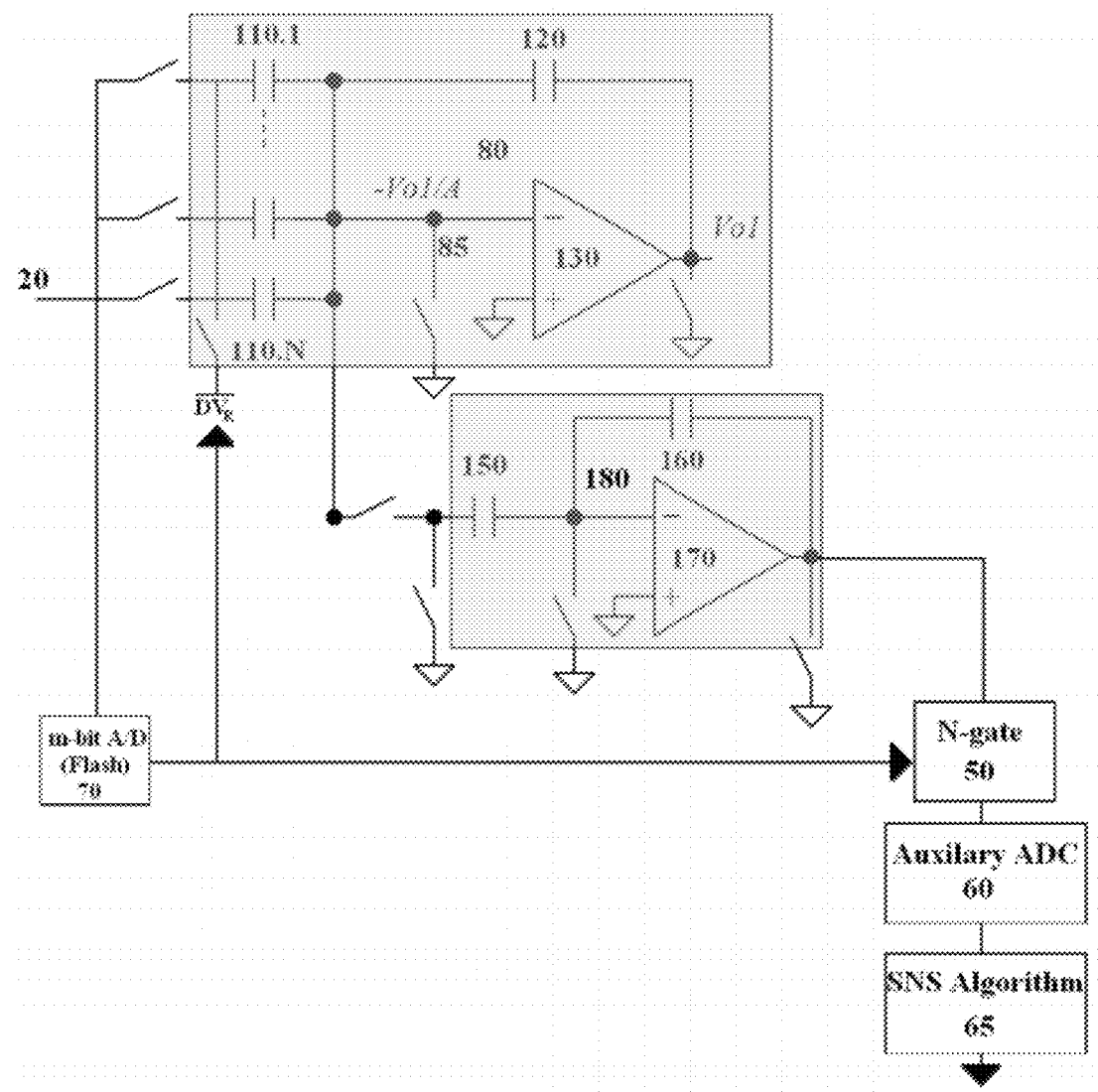
FIG. 6 is a diagram of the integrated circuit with gating of the sampling process of the summing-node voltage input occurring after a connected sampling network, but before digitization occurs.

FIG. 6 illustrates the integrated circuit of the summing-node voltage with gating of the input occurring after a sampling network but before digitization by the auxiliary ADC, as demonstrated in the embodiment in FIG. 2. MDAC 80 may contain sampling capacitors 110.1-110.N that are connected to the output of input buffer 30 by a plurality of switches. MDAC 80 may also contain the amplifier 130 which may drive the MDAC. The inverting input terminal of the amplifier

130 may be connected to sampling capacitors 110.1-110.N. The non-inverting terminal of the amplifier 130 may be connected to ground. The output of the amplifier 130 may be connected to a feedback loop which may be connected to capacitor 120. Capacitor 120 may be connected to sampling capacitors 110.1-110.N on one of its capacitor plates.

The summing-node voltage may be determined at node 85, which may be a summing-node of sampling capacitors 110.1-110.N. Node 85 may also be connected to a sampling network and preamplifier. Capacitor 150 may store the summing-node voltage and may be connected to node 85. Capacitors 150 and 160 and amplifier 170 may make up preamplifier 180. Capacitor 150 may also be connected to the inverting input of amplifier 170. The non-inverting input of the amplifier 170 may be connected to ground. The output of the amplifier 170 may be connected via a feedback loop to the inverting input through capacitor 160. The output of the amplifier 170 may also be connected to N-gate cell 50.

N-gate cell 50 may be selectively controlled by flash ADC 70 in the respective stage of the ADC via an input code D, which may be the output of flash ADC 70. Flash ADC 70 may determine how many sub-ranges to divide the amplified summing-node voltage into, and which sub-range to send through N-gate cell 50 to auxiliary ADC 60 for digitizing. Auxiliary ADC 60 may digitize the selected sub-range and output this sub-range to the SNS algorithm. SNS algorithm unit 65 may execute the SNS algorithm for the received sub-range from auxiliary ADC 60.

During operation, an input signal 20 may be applied to ADC 10. The signal may be output by input buffer 30 to ADC 10. A respective switch from the plurality of switches may close, enabling input signal 20 to be applied to the respective sampling capacitor 110.1-110.N. Sampling capacitors 110.1-110.N may store samples of input signal 20 dependent on the closing and opening of the respective switches. The stored charge on capacitors 110.1-110.N is applied to the inverting input of the amplifier 130, which outputs a residue voltage, $V_{o1}$. The voltage at node 85 (summing-node voltage) may be equal to $-V_{o1}/A$, where A is the open-loop gain of the amplifier 130. The summing-node voltage at node 85 may be applied and stored on capacitor 150 in the sampling network and preamplifier. Preamplifier 180 may amplify the stored sampled signal and output the signal to the N-gate cell 50.

Flash ADC 70 may output a code D to N-gate cell 50 that may determine the input level to the ADC 10. The flash ADC 70 may determine the level of the input to the ADC 10 to be within any of the $2^m$ sub-ranges, where m may be equal to the number of bits of flash ADC 70. In an embodiment, flash ADC 70 may have 3-bits and may be used to gate the sampling process of the summing-node voltage by gating the sampling network of the preamplifier. The amplified summing-node voltage may be divided into 8 groups depending on which sub-range of the input 20 they correspond to. In an example embodiment, the middle sub-range, which correspond to the summing-node voltage values when the amplitude of the input 20 is near zero, may be selected. N-gate cell 50 may output a voltage corresponding to the selected sub-range to auxiliary ADC 60. The auxiliary ADC 60 may digitize this voltage and may output this digitized data to the SNS algorithm unit 65 which may execute the SNS algorithm.

In an alternate embodiment, a specific selection of the sub-range may be made. The selection of which sub-range to output to the auxiliary ADC 60 and the SNS algorithm unit 65 may be based on the amplitude of the sampled signal. A signal that spends more time within a sub-range may allow for the selection of that sub-range. An appropriate selection of a sub-range may allow for a faster convergence of the SNS algorithm on a gain estimate. A transition from one sub-range to another may be made, but may be slower than the time constant of the SNS algorithm. If the transition from one sub-range to another is faster than the time constant of the SNS algorithm, the SNS algorithm may still be dependent on the input. A transition time between sub-ranges that is slower than the SNS algorithm time constant may allow for independence of the gain estimate from the input.

The residue voltage, $V_{o1}$, may be output to the subsequent stage of pipeline 40. The digitized voltage corresponding to the selected sub-range and the residue voltage may be high-passed filtered to remove offset. Using the LMS algorithm component of the SNS algorithm, an estimate of the open-loop gain of the amplifier 130 may be made. Digital correction unit 90 may use the estimated open-loop gain to correct the inter-stage gain error of the MDAC 80.

Although FIGS. 1-5 illustrate the calibration of the inter-stage error of the MDAC 80 in first stage of pipeline 40, the above method may be applied to any of the remaining stages 43-47 of the pipeline 40 that may require calibration for correction of inter-stage error.

Several embodiments of the invention are specifically illustrated and/or described herein. However, it will be appreciated that modifications and variations of the invention are covered by the above teachings and within the purview of the appended claims without departing from the spirit and intended scope of the invention.

What is claimed is:

1. A method for improving a gain estimate by a summing-node algorithm of a residue amplifier to correct an inter-stage error, the method comprising:
    sampling an input signal on a multiplying digital-to-analog converter (MDAC) housed in a stage of an analog-to-digital converter (ADC);
    amplifying a sampled voltage with a preamplifier;
    digitizing the amplified sampled voltage with an auxiliary analog-to-digital converter (ADC);
    determining a number of sub-ranges with bits from a flash analog-to-digital converter (ADC) housed in the stage of the ADC;
    dividing the digitized amplified sampled voltage into the number of sub-ranges via the flash ADC;
    selecting, by a gating device, a voltage corresponding to a respective sub-range, the respective sub-range corresponding to an amplitude of the sampled voltage; and
    computing the gain estimate by the summing-node algorithm using the voltage and a residue voltage.

2. The method according to claim 1, further comprising:
    switching from the respective sub-range to a different sub-range.

3. The method according to claim 1, wherein a sampling rate of the auxiliary ADC is slower than a sampling rate of the ADC.

4. The method according to claim 1, wherein the method is implemented for a first stage of the ADC.

5. The method according to claim 1, wherein the method is implemented for subsequent stages of the ADC.

6. The method according to claim 1, wherein the residue amplifier is housed in the MDAC and drives the MDAC.

7. The method according to claim 1, wherein the residue voltage is an output of the residue amplifier.

8. The method according to claim 1, wherein the input signal is sampled on a sample and hold circuit on the MDAC.

9. The method according to claim 1, wherein the ADC is a pipelined ADC.

10. The method according to claim 1, wherein the stage is one of a plurality of stages.

11. The method according to claim 2, wherein a transition to the different sub-range corresponds to a change in the amplitude of the sampled input signal.

12. The method according to claim 11, wherein the transition to the different sub-range from the respective sub-range occurs at a speed that is slower than a time constant of the summing-node algorithm.

13. The method according to claim 11, wherein the transition from the respective sub-range to the different sub-range allows for a faster convergence of the summing-node algorithm.

14. The method according to claim 8, wherein the input signal is sampled on a plurality of capacitors.

15. The method according to claim 14, wherein the capacitors are connected at a summing-node where a summing-node voltage is determined.

16. The method according to claim 15, wherein the summing-node voltage is output to the preamplifier.

17. The method according to claim 15, wherein the summing-node voltage is applied to an inverting input of the residue amplifier.

18. A method for improving a gain estimate by a summing-node algorithm of a residue amplifier to correct an inter-stage error, the method comprising:
sampling an input signal on a multiplying digital-to-analog converter (MDAC) housed in a stage of an analog-to-digital converter (ADC);
amplifying a sampled voltage with a preamplifier;
determining a number of sub-ranges with bits from a flash analog-to-digital converter (ADC) housed in the stage of the ADC;
dividing the amplified sampled voltage into the number of sub-ranges via the flash ADC;
selecting, by a gating device, a voltage corresponding to a respective sub-range, the respective sub-range corresponding to an amplitude of the sampled voltage;
outputting the voltage corresponding to the respective sub-range to an auxiliary analog-to-digital converter (ADC), the auxiliary ADC digitizing the voltage; and
computing the gain estimate by the summing-node algorithm using the digitized voltage and a residue voltage.

19. The method according to claim 18, further comprising: switching from the respective sub-range to a different sub-range.

20. The method according to claim 18, wherein a sampling rate of the auxiliary ADC is slower than a sampling rate of the ADC.

21. The method according to claim 18, wherein the method is implemented for a first stage of the ADC.

22. The method according to claim 18, wherein the method is implemented for subsequent stages of the ADC.

23. The method according to claim 18, wherein the residue amplifier is housed in the MDAC and drives the MDAC.

24. The method according to claim 18, wherein the residue voltage is an output of the residue amplifier.

25. The method according to claim 18, wherein the input signal is sampled on a sample and hold circuit on the MDAC.

26. The method according to claim 18, wherein the ADC is a pipelined ADC.

27. The method according to claim 18, wherein the stage is one of a plurality of stages.

28. The method according to claim 19, wherein a transition to the different sub-range corresponds to a change in the amplitude of the sampled input signal.

29. The method according to claim 28, wherein the transition to the different sub-range from the respective sub-range occurs at a speed that is slower than a time constant of the summing-node algorithm.

30. The method according to claim 28, wherein the transition from the respective sub-range to the different sub-range allows for a faster convergence of the summing-node algorithm.

31. The method according to claim 25, wherein the input signal is sampled on a plurality of capacitors.

32. The method according to claim 31, wherein the capacitors are connected at a summing-node where a summing-node voltage is determined.

33. The method according to claim 32, wherein the summing-node voltage is output to the preamplifier.

34. The method according to claim 32, wherein the summing-node voltage is applied to an inverting input of the residue amplifier.

35. An integrated circuit that improves a gain estimate by a summing-node algorithm of a residue amplifier to correct an inter-stage error, comprising:
an analog-to-digital converter (ADC) having a plurality of stages, wherein each stage of the ADC includes a flash analog-to-digital converter (ADC) and a multiplying digital-to-analog converter (MDAC) that samples an input signal;
a gating device being controlled by bits of the flash ADC, the flash ADC dividing the sampled signal into a plurality of sub-ranges, wherein the gating device selects a voltage corresponding to a respective sub-range;
an auxiliary analog-to-digital converter (ADC) connected to the gating device; and
a unit that uses the summing-node algorithm to compute the gain estimate using a residue voltage and the voltage corresponding to the respective sub-range.

36. The integrated circuit according to claim 35, wherein the gating device outputs the voltage corresponding to the respective sub-range to the auxiliary ADC.

37. The integrated circuit according to claim 36, wherein the auxiliary ADC digitizes the voltage and outputs the digitized voltage to the unit.

38. The integrated circuit according to claim 36, wherein a different sub-range is chosen, the different sub-range having a corresponding voltage that is output to the auxiliary ADC.

39. The integrated circuit according to claim 35, wherein the gating device is connected to the residue amplifier.

40. The integrated circuit according to claim 35, wherein a sampling rate of the auxiliary ADC is slower than a sampling rate of the ADC.

41. The integrated circuit according to claim 35, wherein the gain estimate is determined for a first stage of the ADC.

42. The integrated circuit according to claim 35, wherein the gain estimate is determined for subsequent stages of the ADC.

43. The integrated circuit according to claim 35, wherein the residue amplifier is housed in the MDAC and drives the MDAC.

44. The integrated circuit according to claim 35, wherein the residue voltage is an output of the residue amplifier.

45. The integrated circuit according to claim 35, wherein the input signal is sampled on a sample and hold circuit on the MDAC.

46. The method according to claim 35, wherein the ADC is a pipelined ADC.

47. The integrated circuit according to claim 39, wherein a transition to the different sub-range corresponds to a change in the amplitude of the sampled input signal.

48. The integrated circuit according to claim 47, wherein the transition to the different sub-range from the respective sub-range occurs at a speed that is slower than a time constant of the summing-node algorithm.

49. The integrated circuit according to claim 47, wherein the transition from the respective sub-range to the different sub-range allows for a faster convergence of the summing-node algorithm.

50. The integrated circuit according to claim 35, wherein the input signal is sampled on a plurality of capacitors.

51. The integrated circuit according to claim 50, wherein the capacitors are connected at a summing-node where a summing-node voltage is determined.

52. The integrated circuit according to claim 51, wherein the summing-node voltage is output to a preamplifier which amplifies the summing-node voltage.

53. The integrated circuit according to claim 51, wherein the summing-node voltage is applied to an inverting input of the residue amplifier.

54. The integrated circuit according to claim 52, wherein the auxiliary ADC receives the amplified summing-node voltage from the preamplifier, the auxiliary ADC digitizing the amplified summing-node voltage and outputting the amplified digitized summing-node voltage to the gating device.

55. The integrated circuit according to claim 54, wherein the flash ADC and the gating device divide the amplified digitized summing-node voltage into the plurality of sub-ranges, the voltage corresponding to one of the sub-ranges being selectively output to the unit.

56. The integrated circuit according to claim 52, wherein the preamplifier is connected to the residue amplifier.

57. The integrated circuit according to claim 52, wherein the flash ADC and the gating device divide the amplified summing-node voltage into the plurality of sub-ranges, the voltage corresponding to one of the sub-ranges being selectively output to the auxiliary ADC.

58. The integrated circuit according to claim 57, wherein the auxiliary ADC receives the voltage from the gating device, the auxiliary ADC digitizing the voltage and outputting the digitized voltage to the unit.

59. The integrated circuit according to claim 51, wherein the auxiliary ADC digitizes the summing-node voltage.

60. The integrated circuit according to claim 59, wherein the flash ADC and the gating device receive the digitized summing-node voltage from the auxiliary ADC and divide the digitized summing-node voltage into the plurality of sub-ranges, a voltage corresponding to one of the sub-ranges being selectively output to the unit.

61. The integrated circuit according to claim 60, wherein a different sub-range is chosen to output a corresponding voltage to the unit.

62. The integrated circuit according to claim 61, wherein a transition to the different sub-range corresponds to a change in the amplitude of the sampled input signal.

63. The integrated circuit according to claim 62, wherein the transition to the different sub-range from the respective sub-range occurs at a speed that is slower than a time constant of the summing-node algorithm.

64. The integrated circuit according to claim 62, wherein the transition from the respective sub-range to the different sub-range allows for a faster convergence of the summing-node algorithm.

65. A method for improving a gain estimate by a summing-node algorithm of a residue amplifier to correct an inter-stage error, the method comprising:
sampling an input signal on a multiplying digital-to-analog converter (MDAC) housed in a stage of an analog-to-digital converter (ADC);
determining a number of sub-ranges with bits from a flash analog-to-digital converter (ADC) housed in the stage of the ADC;
dividing a sampled voltage into the number of sub-ranges via the flash ADC;
selecting, by a gating device, a voltage corresponding to a respective sub-range, the respective sub-range corresponding to an amplitude of the sampled voltage;
amplifying the voltage through a preamplifier;
digitizing the amplified voltage through an auxiliary analog-to-digital converter (ADC); and
computing the gain estimate by the summing-node algorithm using the digitized amplified voltage and a residue voltage.

\* \* \* \* \*